(12) United States Patent
Lee et al.

(10) Patent No.: US 8,350,247 B2
(45) Date of Patent: Jan. 8, 2013

(54) RESISTIVE RANDOM ACCESS MEMORY HAVING A SOLID SOLUTION LAYER AND METHOD OF MANUFACTURING THE SAME

(75) Inventors: Myoung-jae Lee, Suwon-si (KR); Young-soo Park, Yongin-si (KR); Ran-ju Jung, Suwon-si (KR); Sun-ae Seo, Hwaseong-si (KR); Dong-chul Kim, Suwon-si (KR); Seung-eon Ahn, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 479 days.

(21) Appl. No.: 11/984,277

(22) Filed: Nov. 15, 2007

(65) Prior Publication Data
US 2008/0116438 A1   May 22, 2008

(30) Foreign Application Priority Data
Nov. 16, 2006 (KR) .................. 10-2006-0113385

(51) Int. Cl.
*H01L 47/00* (2006.01)
(52) U.S. Cl. ...... 257/4; 365/129; 365/148; 257/E27.098; 257/E29.17; 257/E21.613; 257/1; 257/2; 257/3; 257/5
(58) Field of Classification Search .......... 365/148, 365/129, 159; 257/E27.084, E27.098, E29.17, 257/E21.613, 1–5, 50, 209, 529, 530
See application file for complete search history.

(56) References Cited

U.S. PATENT DOCUMENTS

| | | | |
|---|---|---|---|
| 5,709,958 A | 1/1998 | Toyoda et al. | |
| 6,034,882 A | 3/2000 | Johnson et al. | |
| 6,185,122 B1 | 2/2001 | Johnson et al. | |
| 6,724,580 B2 * | 4/2004 | Irie et al. | 360/294.4 |
| 6,781,172 B2 | 8/2004 | Moriya et al. | |
| 6,870,755 B2 | 3/2005 | Rinerson et al. | |
| 6,872,963 B2 | 3/2005 | Kostylev et al. | |
| 6,891,749 B2 | 5/2005 | Campbell et al. | |

(Continued)

FOREIGN PATENT DOCUMENTS
CN          1574363          2/2005
(Continued)

OTHER PUBLICATIONS

Chinese Office Action dated Nov. 6, 2009 in corresponding Chinese Application No. 200710192709.6.

(Continued)

*Primary Examiner* — N Drew Richards
*Assistant Examiner* — Yu-Hsi D Sun
(74) *Attorney, Agent, or Firm* — Harness, Dickey & Pierce, P.L.C.

(57) ABSTRACT

A resistive random access memory (RRAM) having a solid solution layer and a method of manufacturing the RRAM are provided. The RRAM includes a lower electrode, a solid solution layer on the lower electrode, a resistive layer on the solid solution layer, and an upper electrode on the resistive layer. The method of manufacturing the RRAM includes forming a lower electrode, forming a solid solution layer on the lower electrode, forming a resistive layer on the solid solution layer and forming an upper electrode on the resistive layer, wherein the RRAM is formed of a transition metal solid solution.

11 Claims, 8 Drawing Sheets

U.S. PATENT DOCUMENTS

| | | |
|---|---|---|
| 7,029,924 B2 | 4/2006 | Hsu et al. |
| 7,521,704 B2 | 4/2009 | Lee et al. |
| 7,538,338 B2 | 5/2009 | Rinerson et al. |
| 2004/0159868 A1 | 8/2004 | Rinerson et al. |
| 2004/0245557 A1 | 12/2004 | Seo et al. |
| 2004/0256697 A1 | 12/2004 | Jang |
| 2005/0052915 A1 | 3/2005 | Herner et al. |
| 2005/0110117 A1 | 5/2005 | Hsu |
| 2005/0145910 A1 | 7/2005 | Tamai et al. |
| 2005/0146955 A1 | 7/2005 | Kajiyama |
| 2005/0161726 A1 | 7/2005 | Shin et al. |
| 2005/0174872 A1 | 8/2005 | Rinerson et al. |
| 2005/0194622 A1 | 9/2005 | Lee et al. |
| 2005/0266686 A1 | 12/2005 | Zhuang et al. |
| 2006/0038221 A1 | 2/2006 | Lee et al. |
| 2006/0098472 A1 | 5/2006 | Ahn et al. |
| 2006/0109704 A1 | 5/2006 | Seo et al. |
| 2006/0120205 A1 | 6/2006 | Odagawa et al. |
| 2006/0289942 A1 | 12/2006 | Horii et al. |
| 2007/0012905 A1 | 1/2007 | Huang |
| 2007/0014149 A1 | 1/2007 | Nagamine et al. |
| 2007/0051998 A1 | 3/2007 | Kil et al. |
| 2007/0069241 A1 | 3/2007 | Yang et al. |
| 2007/0114508 A1 | 5/2007 | Herner et al. |
| 2007/0120580 A1 | 5/2007 | Kim et al. |
| 2007/0228354 A1 | 10/2007 | Scheuerlein |
| 2007/0290186 A1 | 12/2007 | Bourim et al. |
| 2007/0290214 A1* | 12/2007 | Ku et al. .................. 257/79 |
| 2008/0116438 A1 | 5/2008 | Lee et al. |
| 2008/0121865 A1 | 5/2008 | Ahn et al. |

FOREIGN PATENT DOCUMENTS

| | | |
|---|---|---|
| CN | 1652336 | 8/2005 |
| CN | 1790726 | 6/2006 |
| EP | 1657753 | 5/2006 |
| JP | 2005-123361 A | 5/2005 |
| JP | 2005-159359 A | 6/2005 |
| JP | 2006/019444 A | 1/2006 |
| KR | 10-2005-0080662 | 8/2005 |
| KR | 10-0552704 B1 | 2/2006 |
| KR | 10-2006-0018879 | 3/2006 |
| KR | 10-0657897 B1 | 12/2006 |
| KR | 10-0682895 B1 | 2/2007 |
| KR | 10-0773537 | 11/2007 |
| KR | 10-1051704 | 7/2011 |

OTHER PUBLICATIONS

Chinese Office Action with English Translation dated Dec. 31, 2010 for corresponding Chinese Patent Application No. 200710192709.6.
Office Action dated Mar. 30, 2012 in co-pending U.S. Appl. No. 11/797,519.
Korean Office Action dated Feb. 27, 2008 in corresponding Korean Application No. 10-2007-0052918.
European Search Report dated Oct. 23, 2008 in corresponding European Application No. 08157323.0-2222.
English translation of Chinese Office Action dated Jul. 31, 2009 in corresponding Chinese Application No. 200610159882.1.
Chinese Office Action dated Aug. 30, 2010 for corresponding Chinese Patent Application No. 200810108832.X with English translation.
European Office Action dated Jul. 13, 2010 in corresponding European Application No. 08157323.0-2222.
Myoung-Jae Lee et al.; Adv. Mater., vol. 19, pp. 73-76 (2007).
Ranju Jung et al.; Applied Physics Letters, vol. 91 (2); 022112-1-022112-3 (2007).
Korean Office Action mailed Mar. 22, 2012 in corresponding Korean Application No. 10-2006-0113385.
Korean Office Action mailed Apr. 23, 2012 in corresponding Korean Application No. 10-2006-0040389.

* cited by examiner

RESISTIVE RANDOM ACCESS MEMORY HAVING A SOLID SOLUTION LAYER AND METHOD OF MANUFACTURING THE SAME

PRIORITY STATEMENT

This application claims the benefit of Korean Patent Application No. 10-2006-0113385, filed on Nov. 16, 2006, in the Korean Intellectual Property Office, the disclosure of which is incorporated herein in its entirety by reference.

BACKGROUND

1. Field

Example embodiments relate to a resistive random access memory (RRAM) having a solid solution layer and method of manufacturing the same. Other example embodiments relate to a RRAM having a transition metal solid solution layer between an electrode and a resistive layer to stabilize voltage and resistance variations of the RRAM.

2. Description of the Related Art

Conventionally, a semiconductor memory array structure includes memory cells, which are connected to one another. Each of the conventional memory cells of a dynamic random access memory (DRAM), which represents a semiconductor memory, includes a switch and a capacitor. DRAMs exhibit high integration and fast operating speed. If the power supply is removed from the DRAM, then all of the stored data is erased from the DRAM.

A flash memory represents a non-volatile memory capable of preserving stored data from being erased after the power supply is removed. Flash memories have non-volatile characteristics that are different than a volatile memory. Flash memories have a lower degree of integration and a slower operating speed than a DRAM.

Examples of a non-volatile memory, which have been studied, include a magnetic RAM (MRAM), a ferroelectric RAM (FRAM), a phase-change RAM (PRAM), etc.

MRAMs and FRAMs have been the focus of recent research. MRAMs store data according to the change in the polarization direction of a tunnel junction. FRAMs store data using polarization characteristics of a ferroelectric layer. MRAMs and FRAMs have higher integration, faster operating speeds and increased data retention characteristics. MRAMs and FRAMs may be driven at a lower power.

PRAMs store data according to a change in the resistance value caused by a phase change of a specific material. PRAMs include a resistor and a switch (transistor). If a method of manufacturing a conventional DRAM is used to manufacture the PRAM, then etching is difficult to perform. The additional time needed to etch may lower productivity and increase unit cost of PRAM products. As such, the competitive power of PRAMs may decrease.

A resistive RAM (RRAM) stores data according to a change in a variable resistance characteristic of a transition metal oxide (i.e., a resistance value varying according to voltage).

Figure 1A:
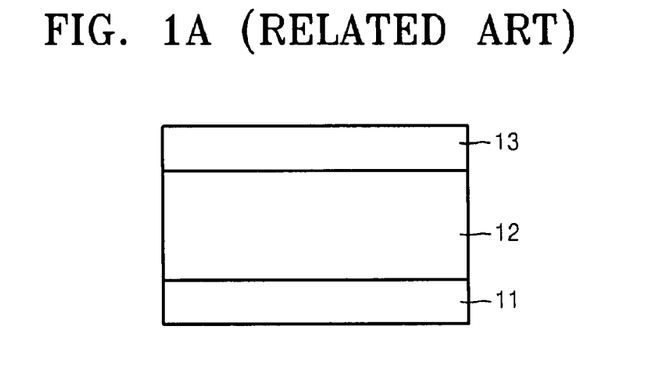
FIG. 1A is a diagram illustrating a cross-sectional view of a conventional resistive random access memory (RRAM) including a resistance variation material having a conventional structure.

FIG. 1A is a diagram illustrating a cross-sectional view of a conventional RRAM using a conventional resistive transformation material having a conventional structure.

Referring to FIG. 1A, the conventional RRAM includes a lower electrode 11, a resistive layer 12 and an upper electrode 13, sequentially formed. The resistive layer 12 may be formed of a transition metal oxide. The lower and upper electrodes 11 and 13 may be formed of electrode materials used for a conventional semiconductor memory device.

Figure 1B:
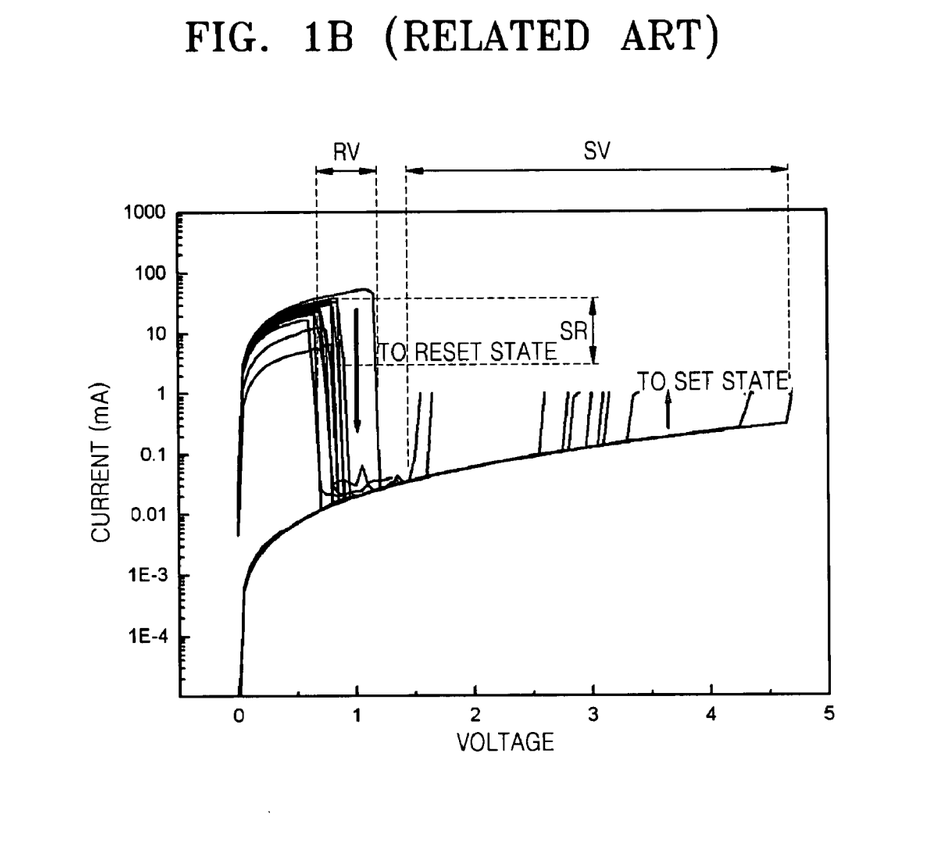
FIG. 1B is a graph illustrating variations of in current with respect to a voltage applied to the conventional RRAM of FIG. 1A.

FIG. 1B is a graph illustrating a relationship between a voltage V applied to the lower and upper electrodes 11 and 13 and a current I flowing in the resistive layer 12. The resistive layer 12 may be formed of a transition metal oxide as described above.

Referring to FIG. 1B, the voltage V was gradually increased from 0V in order to measure variations in the current flowing in the resistive layer 12. The current flowing in the resistive layer 12 gradually increases for an applied voltage between 0V and about 1V. The current flowing in the resistive layer 12 decreases in response to an increase in resistance at a voltage V of about 1V. The current flowing in the resistive layer 12 increases in response to a further increase of the voltage V. A higher resistance state of the resistive layer 12 refers to a reset state and a lower resistance state of the resistive layer 12 refers to a set state.

In FIG. 1B, the voltage applied when the set state changes into the reset state is referred to as a reset voltage RV. The reset voltage is within a range between about 0.6V and 1.2V. The highest value of a resistance SR in the set state may be 10 or more times greater than the lowest value of a resistance SR in the set state. A set voltage SV, which is applied when the reset state changes into the set state, may be within a range between 1.5V and 4.6V. As such, the set voltage SV may have a higher variation value.

As described above, the voltage and the resistance variations of the conventional RRAM are higher due to an unstable resistance level of the resistive layer 12. Reliability of the conventional RRAM decreases due to unstable set and reset voltages, etc.

SUMMARY

Example embodiments relate to a resistive random access memory (RRAM) having a solid solution layer and method of manufacturing the same. Other example embodiments relate to a RRAM having a transition metal solid solution layer formed between an electrode and a resistive layer to stabilize voltage and resistance variations of the RRAM.

Example embodiments also provide a resistive random access memory (RRAM) including a resistance variation material to stabilize a reset current and a set voltage and a method of manufacturing the RRAM.

According to example embodiments, there is provided a RRAM having a transition metal solid solution wherein the RRAM includes a lower electrode, a solid solution layer on the lower electrode, a resistive layer on the solid layer and an upper electrode on the resistive layer.

The resistive layer may be formed of a transition metal oxide. The transition metal oxide may include NiO, TiO, HfO, ZrO, ZnO, WO, CoO, NbO and combinations thereof. The transition metal of the resistive layer may be Ni.

The solid solution layer may be a transition metal solid solution. The solid solution layer may include Al, Hf, Zr, Zn, W, Co, Au, Pt, Ru, Ir, Ti and combinations thereof. The solid solution layer may be formed by solidification (or solidifying) of a transition metal of the resistive layer into one selected from the group consisting of Al, Hf, Zr, Zn, W, Co, Au, Pt, Ru, Ir, Ti and combinations thereof.

According to example embodiments, there is provided a method of manufacturing a RRAM using a transition metal solid solution, which includes forming a lower electrode, forming a solid solution layer on the lower electrode, forming a resistive layer on the solid layer and forming an upper electrode on the resistive layer.

A transition metal alloy target may be formed (or deposited) on the lower electrode using sputtering to form the solid layer. Transition metal targets may be formed (or deposited) on the lower electrode using co-sputtering to form the solid layer.

The pressure of the gas in the process chamber may be controlled during the formation of the resistive layer to form the solid layer. The pressure of the gas may be in a range between 0.1 mTrr and 3 mTrr.

BRIEF DESCRIPTION OF THE DRAWINGS

Example embodiments will be more clearly understood from the following detailed description taken in conjunction with the accompanying drawings. FIGS. 1-9 represent non-limiting, example embodiments as described herein.

DETAILED DESCRIPTION

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a resistive random access memory (RRAM) having a solid solution layer and method of manufacturing the same. Other example embodiments relate to a RRAM including a transition metal solid solution layer between an electrode and a resistive layer to stabilize voltage and resistance variations of the RRAM.

Figure 2A:
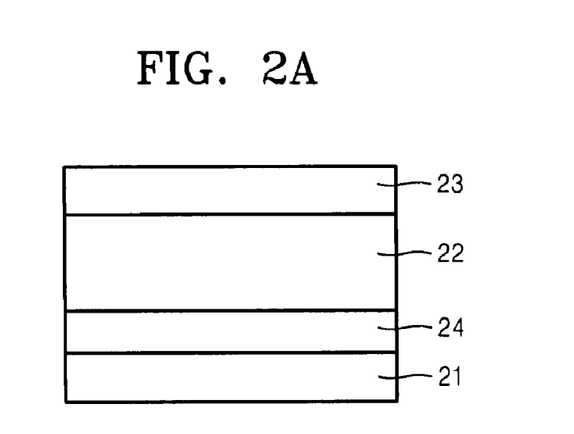
FIG. 2A is a diagram illustrating a cross-sectional view of a RRAM having a transition metal solid solution layer according to example embodiments.

FIG. 2A is diagram illustrating a cross-sectional view of a RRAM having a transition metal solid solution layer according to example embodiments.

Referring to FIG. 2A, a solid solution layer 24 is formed on a lower electrode 21. A resistive layer 22 and an upper electrode 23 are sequentially formed on the solid solution layer 24. The lower and upper electrodes 21 and 23 may be formed of electrode materials used for a semiconductor device (e.g., Al, Hf, Zr, Zn, W, Co, Au, Pt, Ru, Ir, Ti, etc.). The resistive layer 22 may be formed of a material used for a conventional RRAM (e.g., transition metal oxide). For example, the resistive layer 22 may be formed of at least one selected from the group consisting of NiO, $TiO_2$, HfO, ZrO, ZnO, $WO_3$, CoO, CuO, $Nb_2O_5$ and combinations thereof. The thickness of the resistive layer 22 may be selectively adjusted within a range between 5 nm and 500 nm.

According to example embodiments, the RRAM includes the solid solution layer 24 between the lower electrode 21 and the resistive layer 22. The solid solution layer 24 may be formed of a transition metal solid solution. The solid solution layer 24 may be formed of a solid solution, which is formed by solidification of (or solidifying) a transition metal of the resistive layer 22 into at least one of Al, Hf, Zr, Zn, W, Co, Au, Pt, Ru, Ir, Ti and combinations thereof. If the resistive layer 22 is formed of NiO, then the solid solution layer 24 may be formed of a compound which is formed by solidification of Ni into at least one of Al, Hf, Zr, Zn, W, Co, Au, Pt, Ru, Ir, Ti and combinations thereof. The solid solution layer 24 may be formed having a thickness between 5 nm and 40 nm.

Figure 2B:
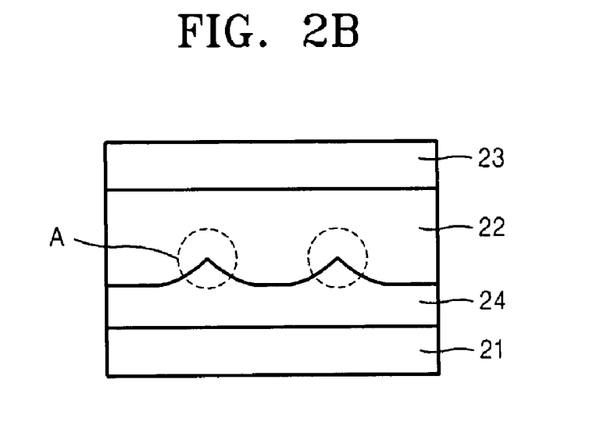
FIG. 2B is a diagram illustrating a cross-sectional view of a RRAM having a transition metal solid solution layer according to example embodiments.

FIG. 2B is a diagram illustrating a cross-sectional view of a RRAM having a transition metal solid solution layer according to example embodiments.

Referring to FIG. 2B, a solid solution layer 24 may be formed on the lower electrode 21. The solid solution layer 24 may have a wave structure including areas A protruding into the resistive layer 22. The areas A may be a current path through which a current flows if a voltage is applied between the lower electrode 21 and the upper electrode 23. Referring to the RRAM in FIG. 1A, if a voltage is applied to the lower electrode 21 and the upper electrode 23, then a current path is changed and the RRAM exhibits a stable resistance characteristic. Referring to the RRAM in FIG. 2B, the areas A are formed in the solid solution layer 24. As such, a portion of the solid solution layer 24 has an area with a reduced distance from the upper electrode 23. A current path forms that allows for a more stable measurement of a resistance characteristic of the RRAM.

The RRAM of FIG. 2A is driven as a 1S (Switch)-1R (Resistance) structure connected to a switch structure (e.g., a transistor or a diode).

Figure 3:
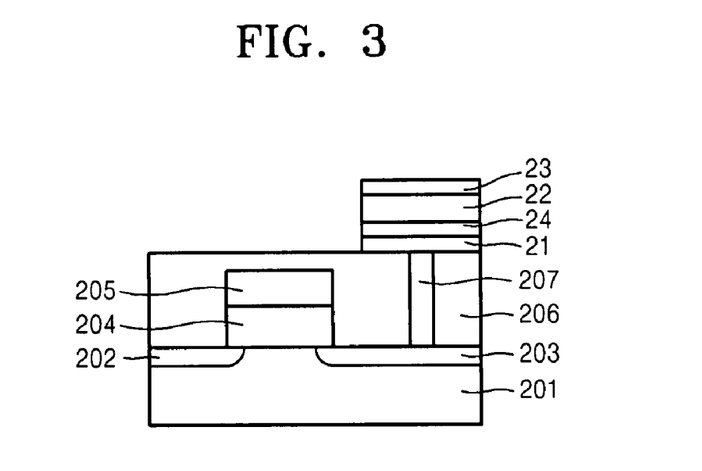
FIG. 3 is a diagram illustrating a cross-sectional view of a RRAM having a transition metal solid solution layer and formed on a transistor structure according to example embodiments.

FIG. 3 is a diagram illustrating a cross-sectional view of a 1T (Transistor)-1R (Resistance) structure of a RRAM including a transition metal solid solution layer wherein the RRAM is connected to a transistor structure according to example embodiments.

Referring to FIG. 3, a source 202 and a drain 203 may be formed in a substrate 201. A gate structure including a gate insulating layer 204 and a gate electrode layer 205 may be formed on the substrate. The gate structure contacts the source 202 and the drain 203. An interlayer insulating layer 206 may be formed on the substrate 201. The interlayer insulating layer 206 may be formed on (or covering) the gate structure. A contact plug 207 may be formed on the source 202 or the drain 203 penetrating the interlayer insulating layer 206. The contact plug 207 is electrically connected to the lower electrode 21 of the RRAM including the transition metal solid solution. According to example embodiments, the RRAM may be connected to a diode structure having a p-type semiconductor layer and an n-type semiconductor layer.

A method of manufacturing the RRAM having a transition metal solid solution layer will now be described. According to example embodiments, the RRAM may be manufactured by sputtering, atomic layer deposition (ALD), chemical vapor deposition (CVD) or similar methods.

The lower electrode 21 may be formed of a conductive material. The lower electrode 21 may be formed of a transition metal (e.g., Al, Au, Pt, Ru, Ir, Ti or the like).

The solid solution layer 24 may be formed on the lower electrode 21. The solid solution layer 24 may be formed by at least three methods.

In a first method of forming the solid solution layer 24, a solid alloy may be formed on the lower electrode 21. If the solid solution layer 24 is formed using reactive sputtering, then an alloy target of Pt and Ni having an adjusted composition ratio may be sputtered to form the solid solution layer 24 on the lower electrode 21.

In a second method of forming the solid solution layer 24, materials for forming the solid solution layer 24 may be co-sputtered using individual targets to form the solid solution layer 24 on the lower electrode 21.

In a third method of forming the solid solution layer 24, the solid solution layer 24 may be formed during the formation of the resistive layer 22. If the solid solution layer 24 is formed of a Pt and Ni solid alloy, then the lower electrode 21 may be formed of Pt followed by the deposition of NiO to form the resistive layer 22. A pressure of a gas including oxygen in a process chamber may be adjusted within a range between 0.1 mTorr and 3 mTorr. Pt present on a surface of the lower electrode 21 may react with Ni to form the solid solution layer 24 on the lower electrode 21.

If the pressure of the gas including oxygen in the process chamber is adjusted to be within the range between 0.1 mTorr and 3 mTorr, then the supply of oxygen decreases. Ni reacts with Pt to form the solid solution layer 24 on the surface of the lower electrode 21.

The resistive layer 22 may be formed on the solid solution layer 24. A partial pressure of oxygen may be adjusted to form the resistive layer 22 of a transition metal oxide.

Figure 4:
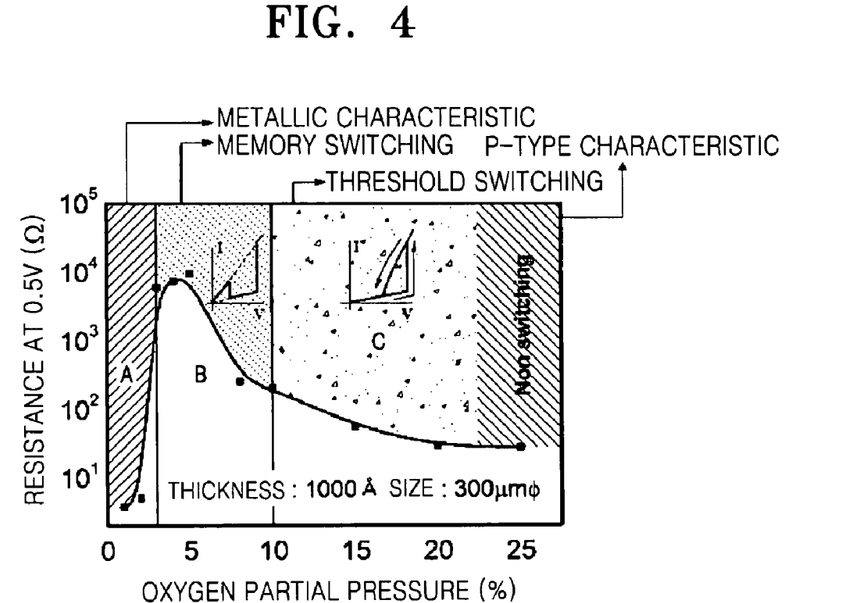
FIG. 4 is a graph illustrating a resistance characteristic with respect to variations of a partial pressure of oxygen of NiO according to example embodiments.

FIG. 4 is a graph illustrating variations of a resistance with respect to a partial pressure of oxygen in a mixture of an inactive gas and oxygen according to example embodiments.

Referring to FIG. 4, if the partial pressure of oxygen is low (see region A), then a metal characteristic similar to Ni develops. If the partial pressure of oxygen is gradually increased from 2.5% to 10% (see region B), then a resistance of NiO increases and a memory switching characteristic develops. If the partial pressure of oxygen is increased to 0.10% or more (see region C), then the resistance of Ni oxide gradually decreases and a threshold switching characteristic develops. If a thin film is manufactured, the same transition metal may be deposited on a sample using sputtering or likewise. The amount of oxygen supplied into a reaction chamber may be adjusted to manufacture the thin film in-situ. Transition metal oxides may show similar characteristics as NiO.

Figure 5:
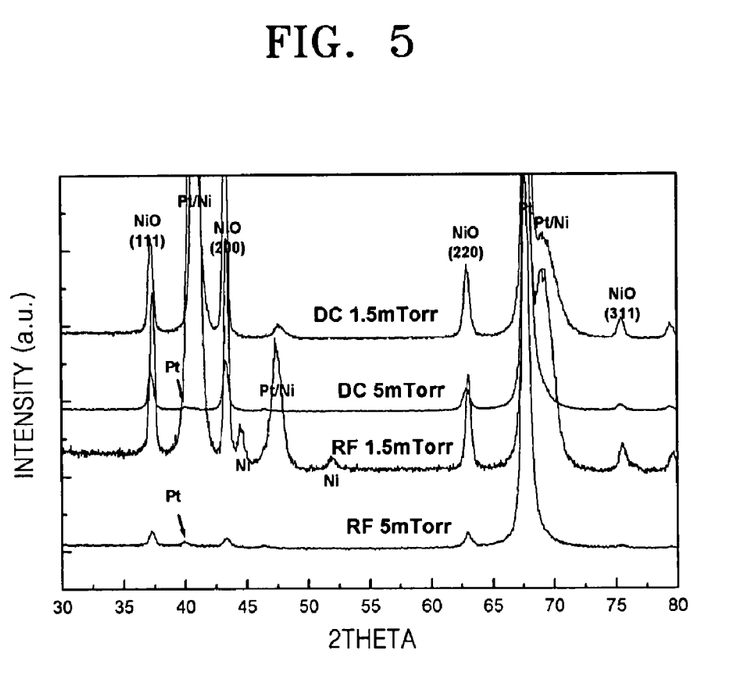
FIG. 5 is a graph illustrating an X-ray diffraction (XRD) data of a solid solution layer formed by adjusting a partial pressure of vapor during the manufacturing of a RRAM including a transition metal solid solution layer according to example embodiments.

FIG. 5 is a graph illustrating X-ray diffraction (XRD) data of a solid solution layer of a RRAM manufactured according to example embodiments. The solid solution layer 24 in FIG. 5 was formed by adjusting a pressure in a process chamber during the formation of the resistive layer 22. The pressure in the process chamber was set within a range between 1.5 mT and 5 mT during direction current (DC) and radio frequency (RF) sputtering.

Referring to FIG. 5, if the pressure in the process chamber is set to 1.5 mT to form the solid solution layer 24, then a Pt/Ni solid layer is formed and a peak related to the Pt/Ni solid layer occurs. If the pressure in the process chamber is set to 5 mT, then the peak related to the Pt/Ni solid layer does not occur.

Figure 6A:
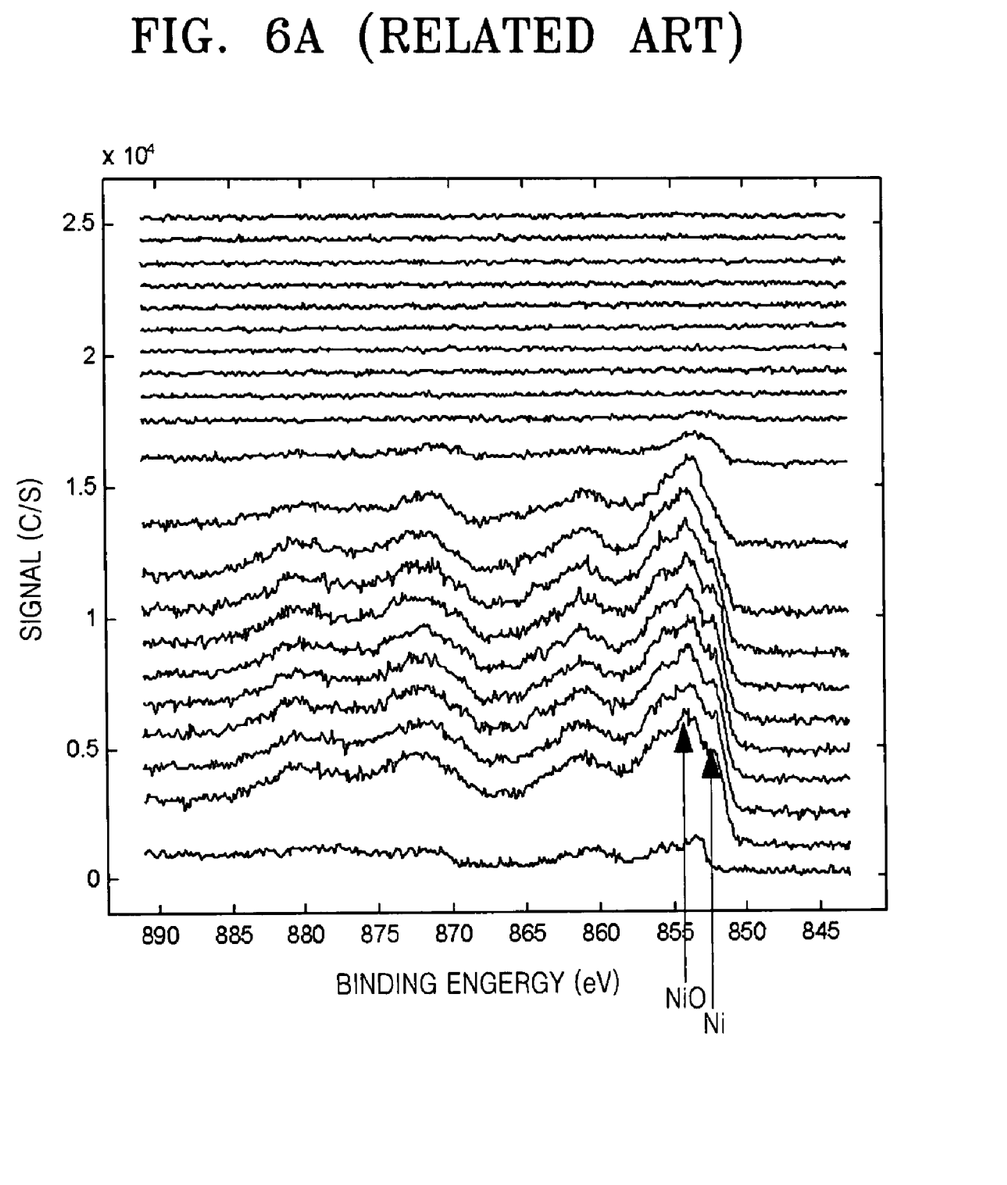
FIGS. 6A and 6B are graphs illustrating X-ray photoelectron spectroscopy (XPS) of a conventional RRAM and a RRAM according to example embodiments, respectively.
Figure 6B:
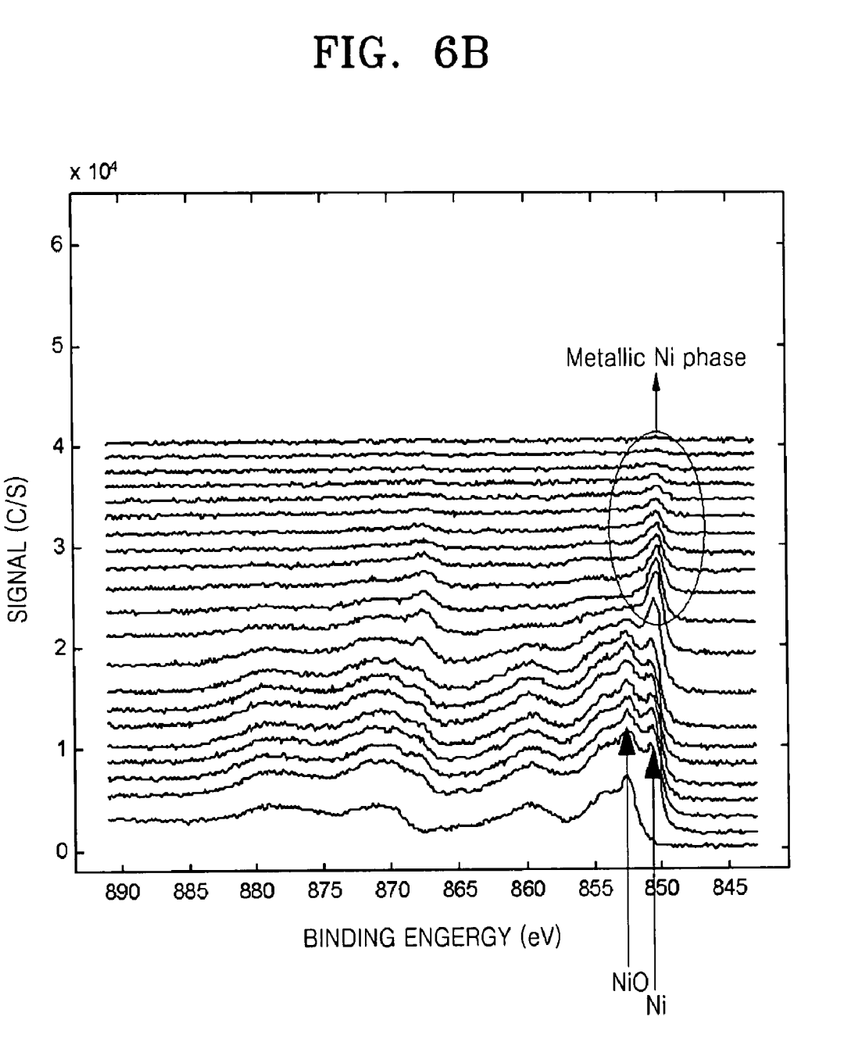

FIG. 6A is a graph illustrating an X-ray photoelectron spectroscopy (XPS) analysis of a conventional RRAM. FIG. 6B is a graph illustrating an XPS analysis of a RRAM having a solid solution layer formed according to example embodiments.

Referring to FIG. 6A, NiO and Ni are present at about the same signal level.

Referring to FIG. 6B, Ni is observed at a higher signal level than NiO. As such, Ni may exist under the resistive layer 22 and may be included in the solid solution layer 24.

Figure 7A:
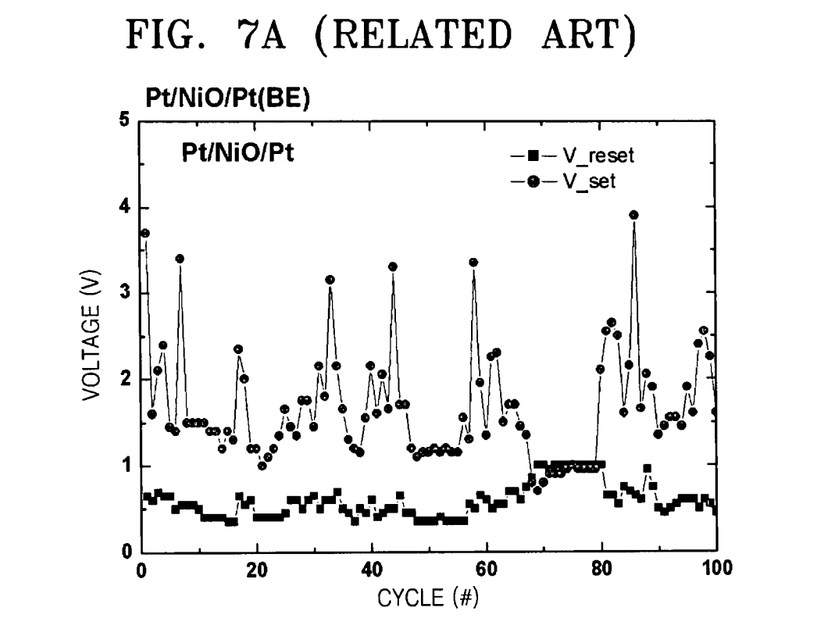
FIGS. 7A and 7B are graphs illustrating variations in the voltage of a conventional RRAM and a RRAM according to example embodiments, respectively.
Figure 7B:
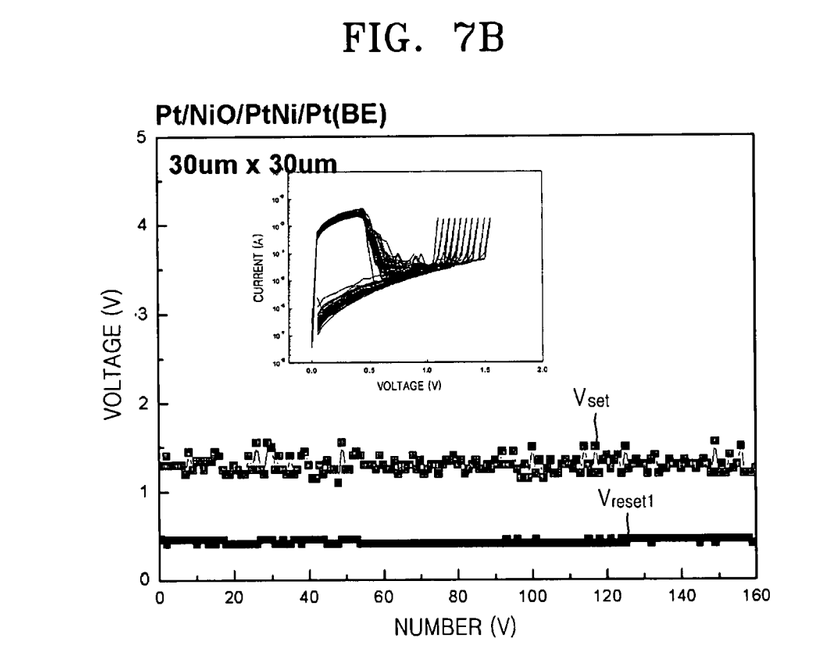

FIG. 7A is a graph illustrating variations of the voltage with respect to the number of operation cycles of a conventional RRAM. FIG. 7B is a graph illustrating variations of the voltage with respect to the number of operation cycles of a RRAM having a solid solution layer formed according to example embodiments.

Referring to FIG. 7A, variations in set and reset voltages may be large. The variation in the set voltage may be substantially larger. As such, the number of operations required to manufacture the RRAM may increase, lowering the reliability of the conventional RRAM. Referring to FIG. 7B, the stability of the set and reset voltages increase.

Figure 8A:
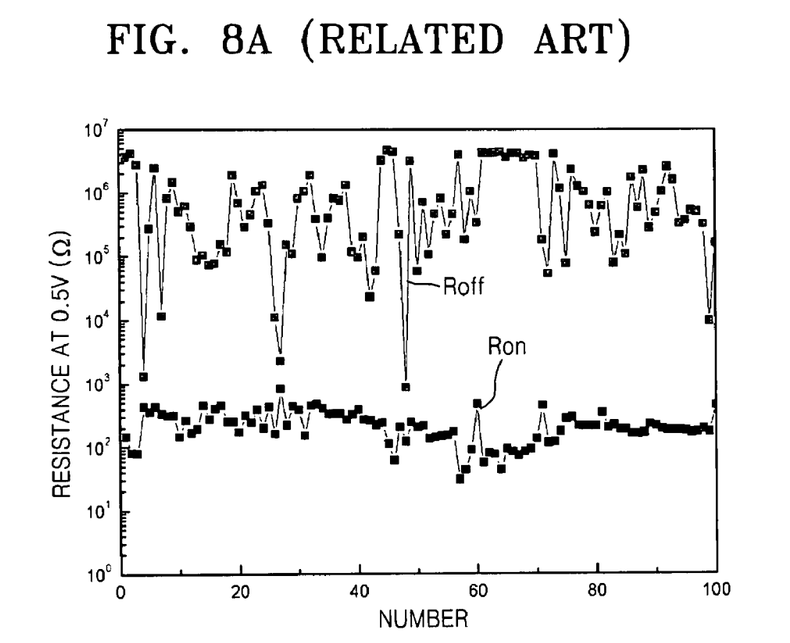
FIGS. 8A and 8B are graphs illustrating variations in the resistance of a conventional RRAM and a RRAM according to example embodiments, respectively.
Figure 8B:
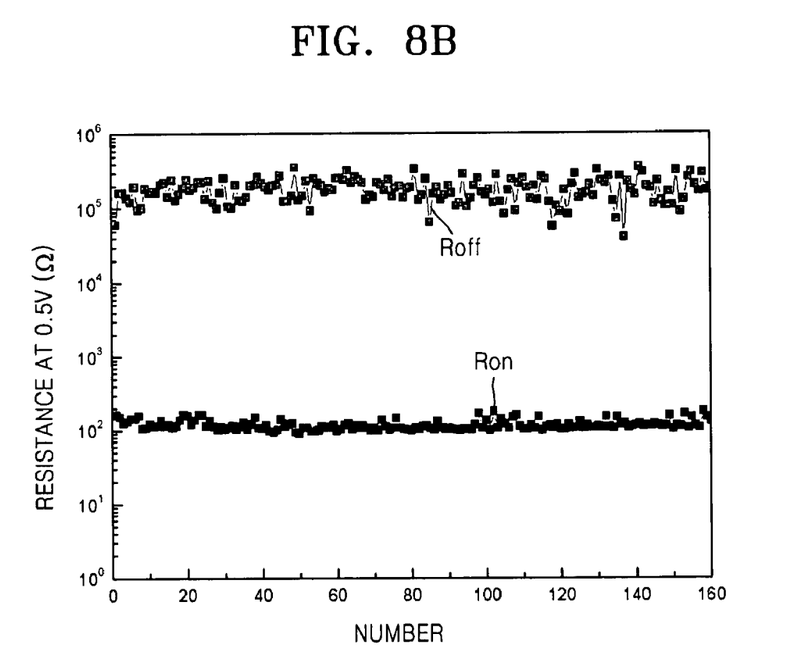

FIG. 8A is a graph illustrating variations the resistance with respect to the number of operation cycles of a conventional RRAM. FIG. 8B is a graph illustrating variations of resistance with respect to the number of operation cycles of a RRAM including a solid solution layer formed according to example embodiments.

Referring to FIGS. 8A and 8B, the variations in the resistance of the RRAM according to example embodiments is substantially lower than the conventional RRAM.

Figure 9:
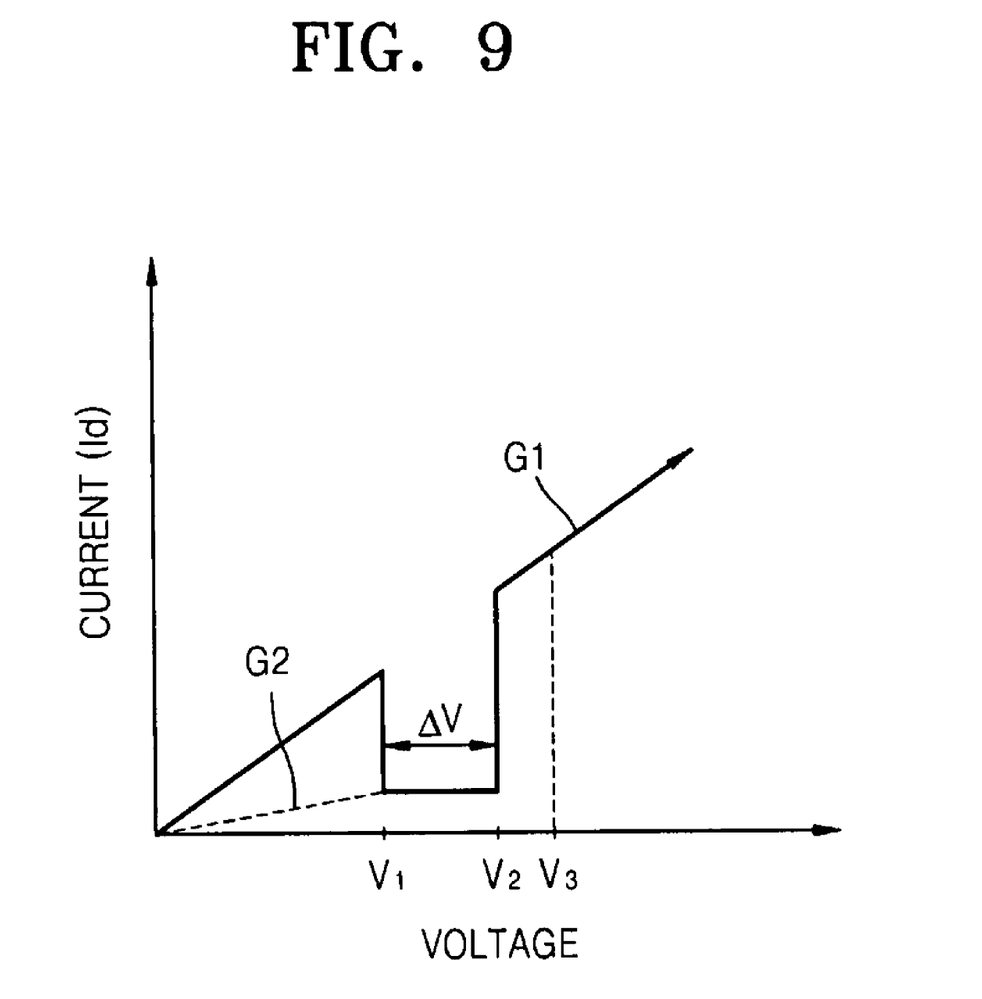
FIG. 9 is a graph illustrating simplified electrical characteristics of a RRAM including a resistance variation material according to example embodiments.

FIG. 9 is a graph illustrating operational characteristics of a RRAM according to example embodiments. In FIG. 9, the horizontal axis denotes an applied voltage and the vertical axis denotes the change (or variations) in a current with respect to the applied voltage.

Referring to FIG. 9, if a voltage is gradually increased from 0V, then the current is increased in proportion to the voltage as shown in region $G_1$ of the graph. If a voltage greater than a voltage $V_1$, but less than a voltage $V_2$ is applied, then a resistance of the RRAM increases and the current decreases as shown in region $G_3$ of the graph. If a voltage $V_2$ greater the voltage $V_1$ ($V_2 > V_1$) is applied, then the resistance is decreases and current increases as shown in region $G_1$ of the graph.

The electrical characteristics of the RRAM may be affected if a voltage lower than the voltage $V_1$ is applied in response to the intensity of a voltage greater than the voltage $V_1$. For example, if the voltage between the voltages $V_1$ and $V_2$ is applied to the RRAM and the voltage less than the voltage $V_1$ is applied, then a current as shown in region $G_2$ of the graph of FIG. 9 is observed. If a voltage $V_3$ greater than the voltage $V_2$ is applied to the RRAM and the voltage less than the voltage $V_1$ is applied, then a current as shown in region $G_1$ of the graph of FIG. 9 is observed. As such, an intensity of a voltage applied within a range greater than the voltage $V_1$ affects the electrical characteristics of the RRAM.

According to example embodiments, a transition metal oxide may be used as a RRAM applied as a multi-layer film having a resistance gradient. For example, the state of a RRAM having a voltage between $V_1$ and $V_2$ applied thereto may be designated as "0" and the state of the RRAM having a voltage greater than $V_2$ applied thereto may be designated as "1" in order to record data. If data is reproduced, then the voltage less than $V_1$ is applied to the RRAM to measure a drain current $I_d$ in order to check whether stored data is in a state of "0" or "1." As such, the states of "1" and "0" may be selectively designated.

A reset voltage $V_1$ and a set voltage $V_2$ depending on an increase in the number of operations are constant in order to use a RRAM according to example embodiments and a set resistance is constant. The set voltage, the reset voltage and the resistance are constant in a RRAM using a transition metal solid solution according to example embodiments as shown in FIGS. 7B and 8B, producing a more stable RRAM.

As described above, in a RRAM and a method of manufacturing the RRAM according to example embodiments, the set voltage, the reset voltage and the resistance may be stabilized while operating the RRAM. As such, a more reliable RRAM may be manufactured. A solid layer may be more easily formed using an additional manufacture process while forming a resistive layer. Information may be stored and reproduced using the method. The RRAM according to example embodiments may operate at a higher speed.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A resistive random access memory (RRAM), comprising:
    a lower electrode including a first transition metal;
    a solid solution layer on the lower electrode;
    a resistive layer on the solid solution layer, the resistive layer including a second transition metal; and
    an upper electrode on the resistive layer,
    wherein the solid solution layer is a transition metal alloy composed of a solidification of the second transition metal of the resistive layer and the first transition metal of the lower electrode, and
    wherein the solid solution layer includes areas that protrude into the resistive layer.

2. The RRAM of claim 1, wherein the resistive layer is formed of a transition metal oxide.

3. The RRAM of claim 2, wherein the transition metal oxide includes at least one selected from the group consisting of $NiO$, $TiO_2$, $HfO$, $ZrO$, $ZnO$, $WO_3$, $CoO$, $CuO$, $Nb_2O_5$ and combinations thereof.

4. The RRAM of claim 1, wherein the solid solution layer includes at least one selected from the group consisting of Al, Hf, Zr, Zn, W, Co, Au, Pt, Ru, Ir, Ti and combinations thereof.

5. The RRAM of claim 1, wherein the first transition metal of the lower electrode is at least one selected from the group consisting of Al, Hf, Zr, Zn, W, Co, Au, Pt, Ru, Ir, Ti and combinations thereof.

6. The RRAM of claim 1, wherein the second transition metal of the resistive layer is Ni.

7. A method of manufacturing a resistive random access memory (RRAM), comprising:
    forming a lower electrode including a first transition metal;
    forming a solid solution layer on the lower electrode;
    forming a resistive layer on the solid solution layer, the resistive layer including a second transition metal; and
    forming an upper electrode on the resistive layer,
    wherein forming the solid solution layer includes forming a transition metal alloy by solidifying the second transition metal of the resistive layer and the first transition metal of the lower electrode, and
    wherein forming the solid solution layer includes forming areas that protrude into the resistive layer.

8. The method of claim 7, further comprising controlling a pressure of a gas in a process chamber while forming the resistive layer.

9. The method of claim 8, wherein the pressure of the gas is within a range of 0.1mTrr and 3mTrr.

10. The method of claim 8, wherein the second transition metal of the resistive layer is Ni.

11. The method of claim 7, wherein the first transition metal of the lower electrode is at least one selected from the group consisting of Al, Hf, Zr, Zn, W, Co, Au, Pt, Ru, Ir, Ti and combinations thereof.

* * * * *